US012635340B2

(12) United States Patent
Eom

(10) Patent No.: US 12,635,340 B2
(45) Date of Patent: *May 19, 2026

(54) DISPLAY DEVICE

(71) Applicant: Samsung Display Co., Ltd., Yongin-Si (KR)

(72) Inventor: Taejong Eom, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 382 days.

This patent is subject to a terminal disclaimer.

(21) Appl. No.: 18/144,744

(22) Filed: May 8, 2023

(65) Prior Publication Data

US 2023/0276661 A1      Aug. 31, 2023

Related U.S. Application Data

(63) Continuation of application No. 17/337,475, filed on Jun. 3, 2021, now Pat. No. 11,678,517.

(30) Foreign Application Priority Data

Jul. 30, 2020      (KR) ........................ 10-2020-0095403

(51) Int. Cl.
*H10K 59/121*      (2023.01)
*H10K 59/131*      (2023.01)
(52) U.S. Cl.
CPC ....... *H10K 59/1213* (2023.02); *H10K 59/131* (2023.02)

(58) Field of Classification Search
CPC ............. H10K 59/1213; H10K 59/131; H10K 59/123; H10K 59/12; H10K 50/80
See application file for complete search history.

(56) References Cited

U.S. PATENT DOCUMENTS

| | | | |
|---|---|---|---|
| 9,711,083 B2 | 7/2017 | Kim et al. | |
| 10,073,291 B2 * | 9/2018 | Yang ..................... | G02F 1/1368 |
| 10,868,096 B2 | 12/2020 | Park et al. | |

(Continued)

FOREIGN PATENT DOCUMENTS

| | | |
|---|---|---|
| EP | 3648093 A1 | 5/2020 |
| KR | 10-1296485 B1 | 8/2013 |

(Continued)

*Primary Examiner* — Mamadou L Diallo
(74) *Attorney, Agent, or Firm* — Innovation Counsel LLP

(57) ABSTRACT

A display device includes a first active pattern, a first compensation gate electrode disposed on the first active pattern, including a first electrode extension part extending in a first direction and a first electrode protrusion part protruding from the first electrode extension part in a second direction crossing the first direction, and a compensation gate line disposed on the first compensation gate electrode and including a line extension part extending in the first direction and a first line protrusion part protruding from the line extension part in the second direction. The line extension part contacts the first electrode extension part through a first contact hole, wherein the first contact hole may overlap the first electrode extension part. The first line protrusion part may contact the first electrode protrusion part through a second contact hole, wherein the second contact hole may overlap the first electrode protrusion part.

15 Claims, 17 Drawing Sheets

(56) References Cited

U.S. PATENT DOCUMENTS

| | | | | |
|---|---|---|---|---|
| 10,964,761 | B2 * | 3/2021 | Lee | H10K 59/88 |
| 11,605,651 | B2 * | 3/2023 | Wu | H10K 59/126 |
| 2004/0212761 | A1 * | 10/2004 | Kadotani | G02F 1/136209 |
| | | | | 349/110 |
| 2015/0097179 | A1 | 4/2015 | Kim et al. | |
| 2019/0259822 | A1 | 8/2019 | Jeon et al. | |
| 2019/0341431 | A1 * | 11/2019 | Lee | G09G 3/3258 |
| 2020/0135771 | A1 * | 4/2020 | Park | H10D 86/60 |
| 2020/0176539 | A1 | 6/2020 | Sung et al. | |
| 2021/0026481 | A1 * | 1/2021 | Abe | G06F 3/0416 |
| 2021/0202643 | A1 * | 7/2021 | Lee | H10K 59/351 |

FOREIGN PATENT DOCUMENTS

| | | | |
|---|---|---|---|
| KR | 10-2019-0100554 | A | 8/2019 |
| KR | 10-2019-0104091 | A | 9/2019 |
| KR | 10-2061796 | B1 | 1/2020 |

* cited by examiner

F I G.  1

10

| | |
|---|---|
| LIGHT EMITTING STRUCTURE | LES |
| FOURTH CONDUCTION PATTERN | 500 |
| THIRD CONDUCTION PATTERN | 400 |
| SECOND CONDUCTION PATTERN | 300 |
| FIRST CONDUCTION PATTERN | 200 |
| ACTIVE PATTERN | 100 |
| SUBSTRATE | SUB |

100

CA22     CA21

CA13

CA23

CA33

CA14

CA24

CA34

CA12

CA32

CA15

CA31

CA11

CA25

CA35

SUB 1100          2100          3100

D2

D1

200

1210

1213 1211 1212   2210  2220   3210  3220

1222
1220
1221

1240

1230 1250   2230 2250   3230 3250

D2

D1

300

H

1320

1310     2310     3310

D2

D1

100,200,300

400

2430    1410    3430

1420

1430

1440 { 1442
       1441
       2442
       3442

1450    2450    3450

1460

1480    1470    2470    3470

D2
↑
└→ D1

100,200,300,400,500

1510 1520    2510 2520    1540 3510 3520

1530    2530    3530

D2

D1

100,200,400

CNT3  CNT2  CNT1  2430          1410      3430

1420

1430

1442
1441   1440
2442
3442

1450

1460

1480      1470      2450      2470          3450      3470

D2

D1

100,400,500

1510 1520    2510 2520    1540 3510 3520

III ◄                                III'

1530    2530    3530

D2

D1

DISPLAY DEVICE

CROSS-REFERENCE TO RELATED APPLICATION(S)

This application is a continuation application of U.S. patent application Ser. No. 17/337,475 filed on Jun. 3, 2021, which claims priority under 35 USC § 119 to Korean Patent Application No. 10-2020-0095403 filed on Jul. 30, 2020, in the Korean Intellectual Property Office, the disclosure of which is incorporated herein in its entirety by reference.

BACKGROUND

1. Field

The present disclosure relates generally to a display device. More particularly, the present disclosure relates to a display device with a plurality of transistors having improved electrical characteristics of the same.

2. Description of the Related Art

The display device includes a plurality of pixels. Each of the pixels includes a plurality of transistors. Each of the transistors includes a driving transistor that generates a driving current and a switching transistor that provides a data voltage to the driving transistor. The switching transistor may perform a switching operation in response to a gate signal. The gate signal may be provided to the switching transistor through conductive patterns in contact with each other. The conductive patterns may contact each other through a contact hole. However, when the contact hole is not properly formed, the gate signal cannot be provided to the switching transistor. Accordingly, a defect in which the data voltage is not provided to the driving transistor may occur. Therefore, there is need to develop a novel display device which do not deteriorate electrical characteristics of the transistors.

The above information disclosed in this Background section is only for understanding of the background of the present disclosure, and, therefore, it may contain information that does not constitute prior art.

SUMMARY

Some example embodiments provide a display device including a plurality of transistors having improved electrical characteristics.

A display device according to an example embodiment may include a first active pattern, a first compensation gate electrode disposed on the first active pattern, including a first electrode extension part extending in a first direction and a first electrode protrusion part protruding from the first electrode extension part in a second direction crossing the first direction, and a compensation gate line disposed on the first compensation gate electrode and including a line extension part extending in the first direction and a first line protrusion part protruding from the line extension part in the second direction. The line extension part may contact the first electrode extension part through a first contact hole and the first contact hole may overlap the first electrode extension part. The first line protrusion part may contact the first electrode protrusion part through a second contact hole and the second contact hole may overlap the first electrode protrusion part.

According to an example embodiment, the compensation gate line may be electrically connected to the first compensation gate electrode through at least one of the first contact hole and the second contact hole.

According to an example embodiment, the first contact hole may overlap the first electrode extension part adjacent to one side of the first electrode protrusion part, and the second contact hole may overlap another side of the first electrode protrusion part opposite to the one side of the first electrode protrusion part.

According to an example embodiment, the first contact hole and the second contact hole may not overlap the first active pattern.

According to an example embodiment, the first electrode extension part and the line extension part may overlap each other, and the first electrode protrusion part and the first line protrusion part may overlap each other.

According to an example embodiment, a shape of the first electrode protrusion part may be a same as a shape of the first line protrusion part.

According to an example embodiment, the first electrode extension part may overlap a first channel region of the first active pattern, and the first electrode protrusion part may overlap a second channel region of the first active pattern.

According to an example embodiment, the display device may further include a first initialization gate electrode disposed on the first active pattern, and an initialization gate line disposed on the first initialization gate electrode and extending in the first direction.

According to an example embodiment, the first initialization gate electrode may include a first initialization electrode extension part extending in the first direction, a second initialization electrode extension part extending in the first direction and being spaced apart from the first initialization electrode extension part in the second direction, and an initialization electrode connection part extending in the second direction. The first initialization electrode extension part and the second initialization electrode extension part may be protruded from a same side of the initialization electrode connection part.

According to an example embodiment, the first initialization electrode extension part may overlap a third channel region of the first active pattern, and the second initialization electrode extension part may overlap a fourth channel region of the first active pattern.

According to an example embodiment, the initialization gate line may contact the initialization electrode connection part through a third contact hole.

According to an example embodiment, the display device may further include a second active pattern connected to the first active pattern and being disposed in a same layer as the first active pattern and a third active pattern connected to the second active pattern and being disposed in a same layer as the second active pattern.

According to an example embodiment, the first electrode extension part may extend to overlap a fifth channel region of the second active pattern.

According to an example embodiment, the display device may further include a second compensation gate electrode disposed on the second active pattern and having a same shape as the first compensation gate electrode and a third compensation gate electrode disposed on the third active pattern and having a same shape as the second compensation gate electrode. The line extension part may be electrically connected to the second compensation gate electrode and the third compensation gate electrode.

According to an example embodiment, the compensation gate line may include a second line protrusion part protruding from the line extension part in the second direction and contacting a second electrode protrusion part of the second compensation gate electrode and a third line protrusion part protruding from the line extension part in the second direction and contacting a third electrode protrusion part of the third compensation gate electrode.

According to an example embodiment, the display device may further include a second initialization gate electrode disposed on the second active pattern and having a same shape as the first initialization gate electrode and a third initialization gate electrode disposed on the third active pattern and having a same shape as the second initialization gate electrode. The initialization gate line may be electrically connected to the second initialization gate electrode and the third initialization gate electrode.

According to an example embodiment, the display device may further include an initialization voltage line disposed on the compensation gate line and extending in the second direction. The initialization voltage line may provide an initialization voltage to the first to third active patterns.

Therefore, the display device according to an example embodiment may include a compensation gate electrode and a compensation gate line contacting the compensation gate electrode. As the compensation gate line contacts the compensation gate electrode through at least one of a first contact hole and a second contact hole, the compensation gate line may be electrically connected to the compensation gate electrode. The compensation gate line may provide a gate signal to the compensation gate electrode. Since the compensation gate line contacts the compensation gate electrode through at least one of the first and second contact holes, even if one of the first and second contact holes is not properly formed, the compensation gate line may be electrically connected to the gate electrode. Accordingly, a defect in which the data voltage is not transmitted to the transistor may be prevented.

It is to be understood that both the foregoing general description and the following detailed description are example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate example embodiments of the disclosure, and together with the description serve to explain the present disclosure.

FIG. 1 is a block diagram illustrating a display device according to example embodiments.

DETAILED DESCRIPTION

Illustrative, non-limiting example embodiments will be more clearly understood from the following detailed description in conjunction with the accompanying drawings.

Figure 1:
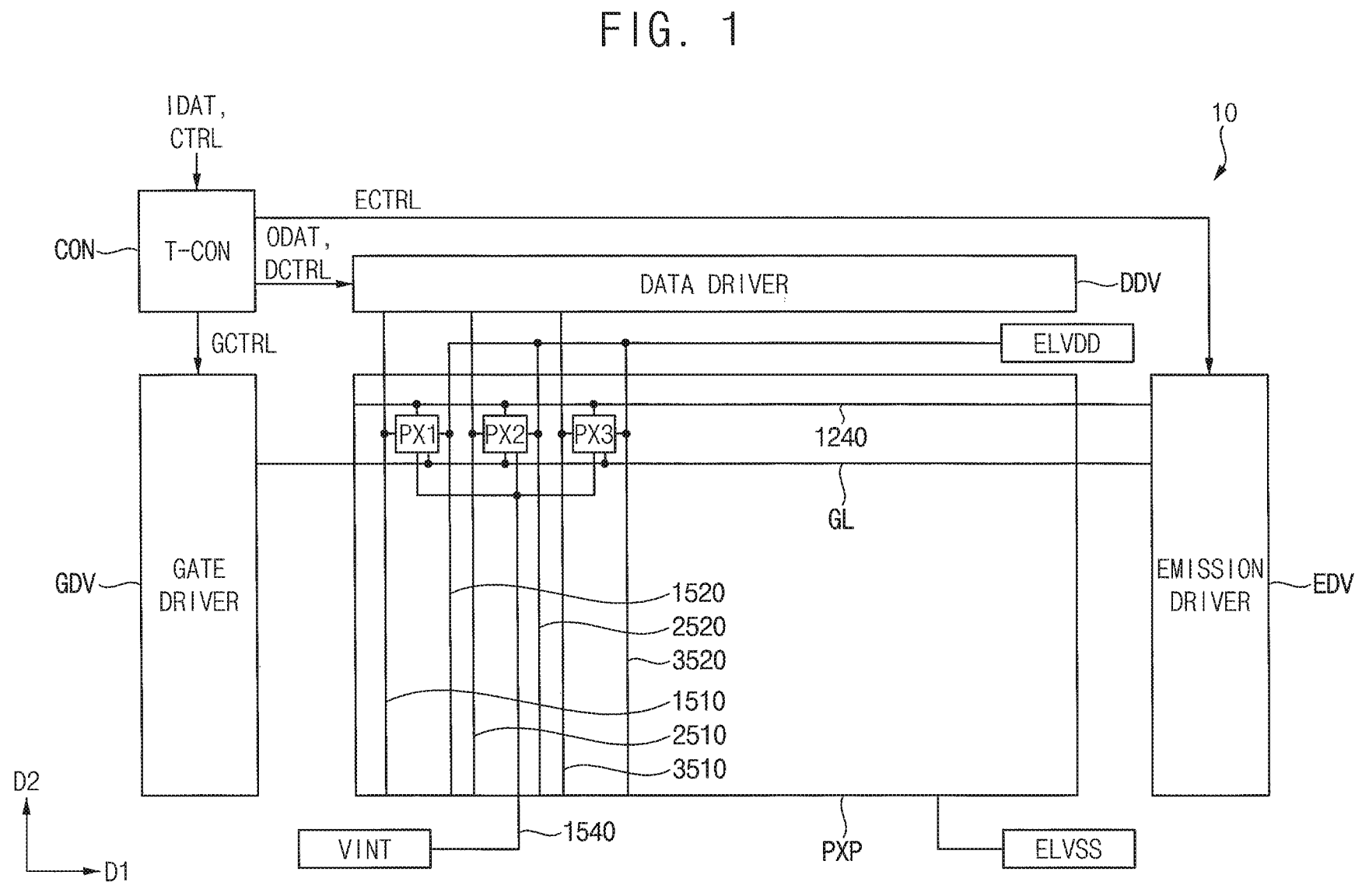
Figure 2:
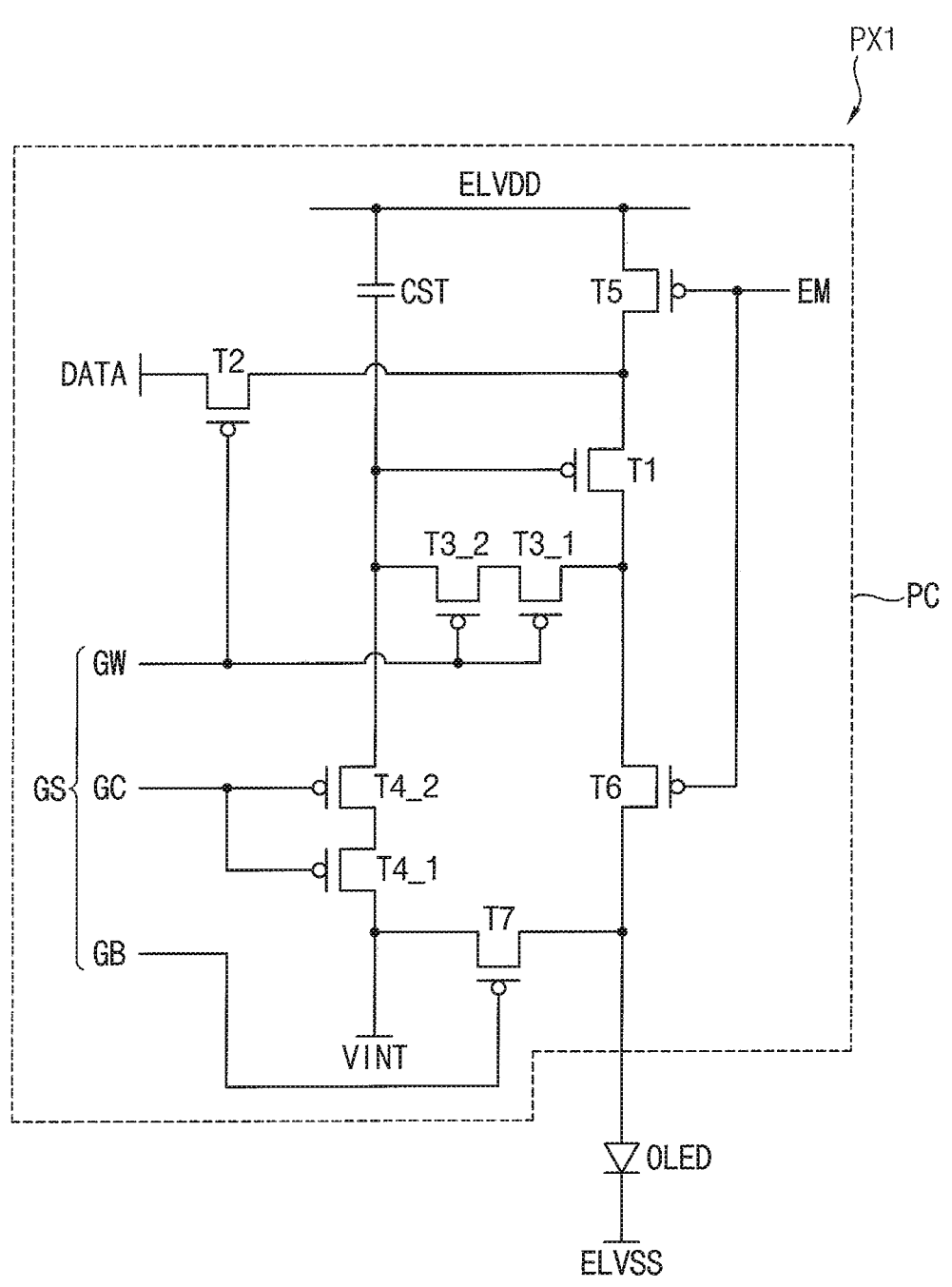
FIG. 2 is an equivalent circuit diagram illustrating a first pixel included in the display device of FIG. 1.

FIG. 1 is a block diagram illustrating a display device according to example embodiments. FIG. 2 is an equivalent circuit diagram illustrating a first pixel included in the display device of FIG. 1.

Referring to FIGS. 1 and 2, a display device 10 according to example embodiments may include a pixel portion PXP, a data driver DDV, a gate driver GDV, an emission driver EDV, and a controller CON.

The pixel portion PXP may include a plurality of pixels. The pixels may be arranged along a first direction D1 and may be arranged along a second direction D2 crossing the first direction D1. For example, the pixel portion PXP may include a first pixel PX1, a second pixel PX2, and a third pixel PX3 arranged along the first direction D1.

In addition, a plurality of gate lines, a plurality of emission control lines, a plurality of data lines, a plurality of high power voltage lines, and a plurality of initialization voltage lines may be disposed in the pixel portion PXP. For example, a gate line GL extending in the first direction D1, an emission control line 1240 extending in the first direction D1, first to third data lines 1510, 2510, and 3510 extending in the second direction D2, first to third high power voltage lines 1520, 2520, and 3520 extending in the second direction D2, and an initialization voltage line 1540 extending in the second direction D2 may be disposed in the pixel portion PXP. For example, the gate line GL, the emission control line 1240, and the initialization voltage line 1540 may be electrically connected to the first to third pixels PX1, PX2, and PX3. The first to third data lines 1510, 2510, and 3510 may be electrically connected to the first to third pixels PX1, PX2, and PX3, respectively, and first to third high power voltage lines 1520, 2520, and 3520 may be electrically connected to the first to third pixels PX1, PX2, and PX3, respectively.

The data driver DDV may generate a data voltage DATA based on an output image data ODAT and a data control signal DCTRL. For example, the data driver DDV may generate the data voltage DATA corresponding to the output image data ODAT, and may output the data voltage DATA in response to the data control signal DCTRL. The data control signal DCTRL may include an output data enable signal, a horizontal start signal, and a load signal. In an example embodiment, the data driver DDV may be implemented with one or more integrated circuits ("ICs").

The gate driver GDV may generate a gate signal GS based on a gate control signal GCTRL. For example, the gate signal GS may include a first gate signal GW, a second gate signal GC, and a third gate signal GB. Each of the first to third gate signals GW, GC, and GB may include a gate-on voltage for turning on a transistor and a gate-off voltage for turning off the transistor. The gate control signal GCTRL may include a vertical start signal, a clock signal, and the like. In an example embodiment, the gate driver GDV may be integrated in the peripheral portion of the pixel portion PXP.

The emission driver EDV may generate an emission driving signal EM based on an emission control signal ECTRL. The emission driving signal EM may include the gate-on voltage and the gate-off voltage. The emission driving signal EM may include a vertical start signal, a clock signal, and the like. In an example embodiment, the emission driver EDV may be integrated in a peripheral portion of the pixel portion PXP. In another example embodiment, the emission driver EDV may be implemented with one or more integrated circuits.

The controller CON (e.g., timing controller T-CON) may receive an input image data IDAT and a control signal CTRL from an external host processor (e.g., GPU). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

As shown in FIG. 2, the first pixel PX1 may include a pixel circuit PC and at least one organic light emitting diode OLED. Equivalent circuit diagrams of the first to third pixels PX1, PX2, and PX3 may be substantially the same. Hereinafter, the equivalent circuit diagram of the first pixel PX1 will be described.

The pixel circuit PC may provide a driving current to the organic light emitting diode OLED. In an example embodiment, the pixel circuit PC may include a plurality of transistors and at least one storage capacitor. For example, the pixel circuit PC may include a first transistor T1, a second transistor T2, third dual transistors T3_1 and T3_2, fourth dual transistors T4_1 and T4_2, and a fifth transistor T5, a sixth transistor T6, a seventh transistor T7, and a storage capacitor CST. The first transistor T1 may be referred to as a driving transistor, the second transistor T2 may be referred to as a switching transistor, the third dual transistors T3_1 and T3_2 may be referred to as a compensation transistor, and the fourth dual transistor T4_1 and T4_2 may be referred to as initialization transistors, the fifth and sixth transistors T5 and T6 may be referred to as emission control transistors, and the seventh transistor T7 may be referred to as an anode initialization transistor.

The first transistor T1 may include a gate terminal, a first terminal (e.g., a source terminal), and a second terminal (e.g., a drain terminal). The gate terminal of the first transistor T1 may be connected to the storage capacitor CST. The first terminal of the first transistor T1 may receive a high power voltage ELVDD. The second terminal of the first transistor T1 may be connected to the sixth transistor T6. The first transistor T1 may generate the driving current based on the high power voltage ELVDD and the data voltage DATA.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. For example, when the second transistor T2 is a PMOS transistor, the second transistor T2 may be turned off when the first gate signal GW has a positive voltage level, and may be turned on when the first gate signal GW has a negative voltage level. The first terminal of the second transistor T2 may receive the data voltage DATA through the first data line 1510. The second terminal of the second transistor T2 may provide the data voltage DATA to the first terminal of the first transistor T1 while the second transistor T2 is turned on.

Each of the third dual transistors T3_1 and T3_2 may include a gate terminal, a first terminal (e.g., a source terminal), and a second terminal (e.g., a drain terminal). The gate terminals of the third dual transistors T3_1 and T3_2 may receive the first gate signal GW. For example, the first gate signal GW may be provided to the gate terminal of the second transistor T2 and to the gate terminals of the third dual transistors T3_1 and T3_2.

The third dual transistors T3_1 and T3_2 may be turned on or off in response to the first gate signal GW. For example, when the third dual transistors T3_1 and T3_2 are PMOS transistors, the third dual transistors T3_1 and T3_2 may be turned on when the first gate signal GW has a negative voltage level and may be turned off when the first gate signal GW has a positive voltage level. During a period in which the third dual transistors T3_1 and T3_2 are turned on in response to the first gate signal GW, the third dual transistors T3_1 and T3_2 may diode-connect the first transistor T1. Accordingly, the third dual transistors T3_1 and T3_2 may compensate for a threshold voltage of the first transistor T1.

Each of the fourth dual transistors T4_1 and T4_2 may include a gate terminal, a first terminal (e.g., a source terminal), and a second terminal (e.g., a drain terminal). The gate terminals of the fourth dual transistors T4_1 and T4_2 may receive the second gate signal GC. The fourth dual transistors T4_1 and T4_2 may transmit an initialization voltage VINT to the gate terminal of the first transistor T1.

The fourth dual transistors T4_1 and T4_2 may be turned on or off in response to the second gate signal GC. For example, when the fourth dual transistors T4_1 and T4_2 are PMOS transistors, the fourth dual transistors T4_1 and T4_2 may be turned on when the second gate signal GC has a negative voltage level and may be turned off when the second gate signal GC has a positive voltage level.

During a period in which the fourth dual transistors T4_1 and T4_2 are turned on in response to the second gate signal GC, the initialization voltage VINT may be provided to the gate terminal of the first transistor T1. Accordingly, the gate terminal of the first transistor T1 may be initialized to the initialization voltage VINT.

The fifth transistor T5 may include a gate terminal, a first terminal (e.g., a source terminal), and a second terminal (e.g., a drain terminal). The gate terminal of the fifth transistor T5 may receive the emission driving signal EM. The first terminal of the fifth transistor T5 may receive the high power voltage ELVDD. The second terminal of the fifth transistor T5 may be connected to the first transistor T1. When the fifth transistor T5 is turned on in response to the emission driving signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission driving signal EM. The first terminal of the sixth transistor T6 may be connected to the first transistor T1. The second terminal of the sixth transistor T6 may be connected to the organic light emitting diode OLED. When the sixth transistor T6 is turned on in response to the emission driving signal EM, the sixth transistor T6 may provide the driving current to the organic light emitting diode OLED.

The seventh transistor T7 may include a gate terminal, a first terminal (e.g., a source terminal), and a second terminal (e.g., a drain terminal). The gate terminal of the seventh transistor T7 may receive the third gate signal GB. The second terminal of the seventh transistor T7 may receive the initialization voltage VINT. The first terminal of the seventh transistor T7 may be connected to the organic light emitting diode OLED. When the seventh transistor T7 is turned on in response to the third gate signal GB, the seventh transistor T7 may provide the initialization voltage VINT to the organic light emitting diode OLED. Accordingly, the seventh transistor T7 may initialize the first terminal of the organic light emitting diode OLED to the initialization voltage VINT.

The storage capacitor CST may include a first terminal and a second terminal. The first terminal of the storage capacitor CST may be connected to the first transistor T1, and the second terminal of the storage capacitor CST may receive the high power voltage ELVDD. The storage capacitor CST may maintain a voltage level of the gate terminal of the first transistor T1 during an inactive period of the first gate signal GW.

The organic light emitting diode OLED may include a first terminal (e.g., an anode terminal) and a second terminal (e.g., a cathode terminal). The first terminal of the organic light emitting diode OLED may be connected to the sixth transistor T6 to receive the driving current and to the seventh transistor T7, and the second terminal may receive a low power voltage ELVSS. The organic light emitting diode OLED may generate light having a luminance corresponding to the driving current.

Meanwhile, a connection structure between the pixel circuit PC and the organic light emitting diode OLED shown in FIG. 2 is an example and may be variously changed.

Figure 3:
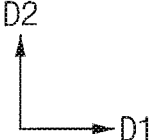
FIG. 3 is a plan view illustrating first, second, and third pixels included in the display device of FIG. 1.
Figure 4:
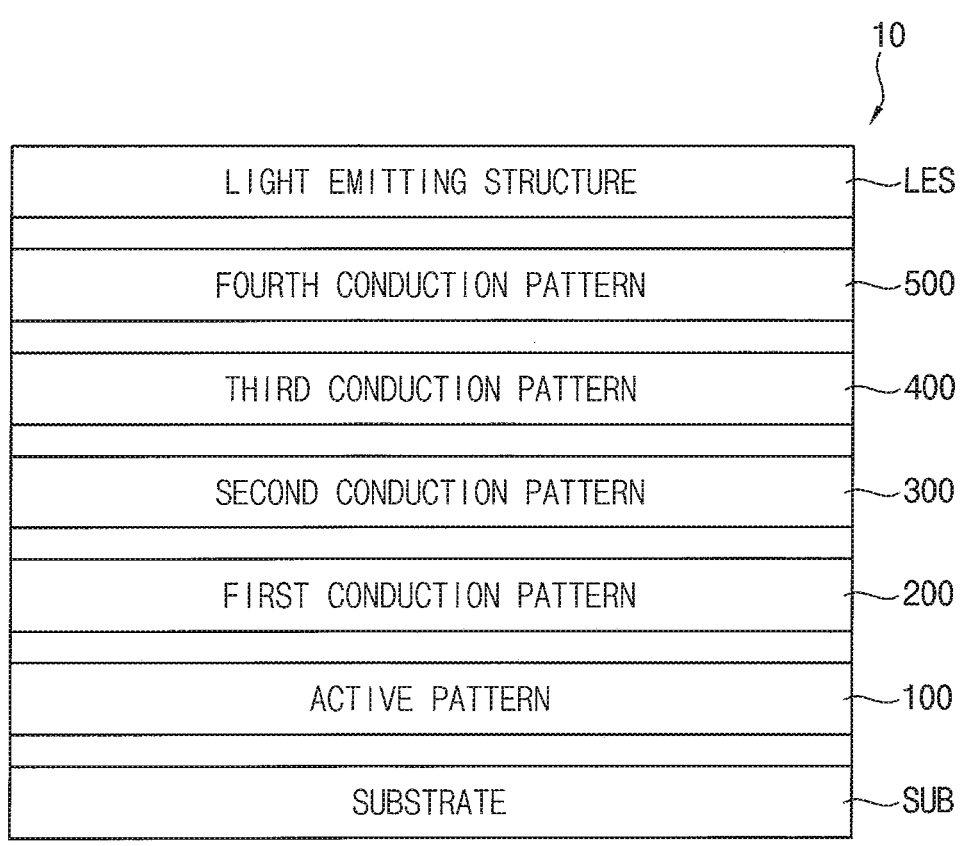
FIG. 4 is a cross-sectional view illustrating a stacked structure of constituent elements included in the display device of FIG. 1.

FIG. 3 is a plan view illustrating the first to third pixels included in the display device of FIG. 1. FIG. 4 is a cross-sectional view illustrating a stacked structure of constituent elements included in the display device of FIG. 1.

Referring to FIGS. 1, 3, and 4, the display device 10 may include a substrate SUB, an active pattern 100 disposed on the substrate SUB, a first conductive pattern 200 disposed on the active pattern 100, a second conductive pattern 300 disposed on the first conductive pattern 200, a third conductive pattern 400 disposed on the second conductive pattern 300, a fourth conductive pattern 500 disposed on the third conductive pattern 400, and a light emitting structure LES disposed on the fourth conductive pattern 500. Insulation layers may be disposed between the above-described components.

The active pattern 100, the first conductive pattern 200, the second conductive pattern 300, the third conductive pattern 400, the fourth conductive pattern 500, and the light emitting structure LES may constitute the first to third pixels PX1, PX2, and PX3. It will be described below.

Figure 16:
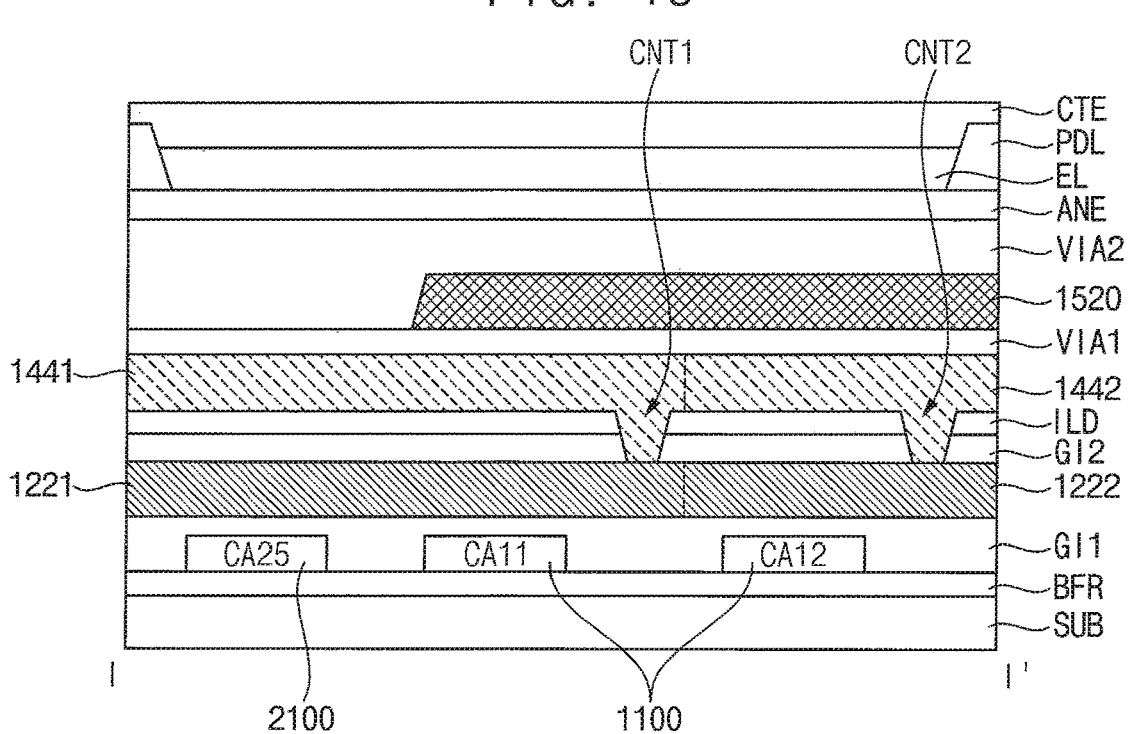
FIG. 16 is a cross-sectional view taken along line I-I' of FIG. 14.
Figure 17:
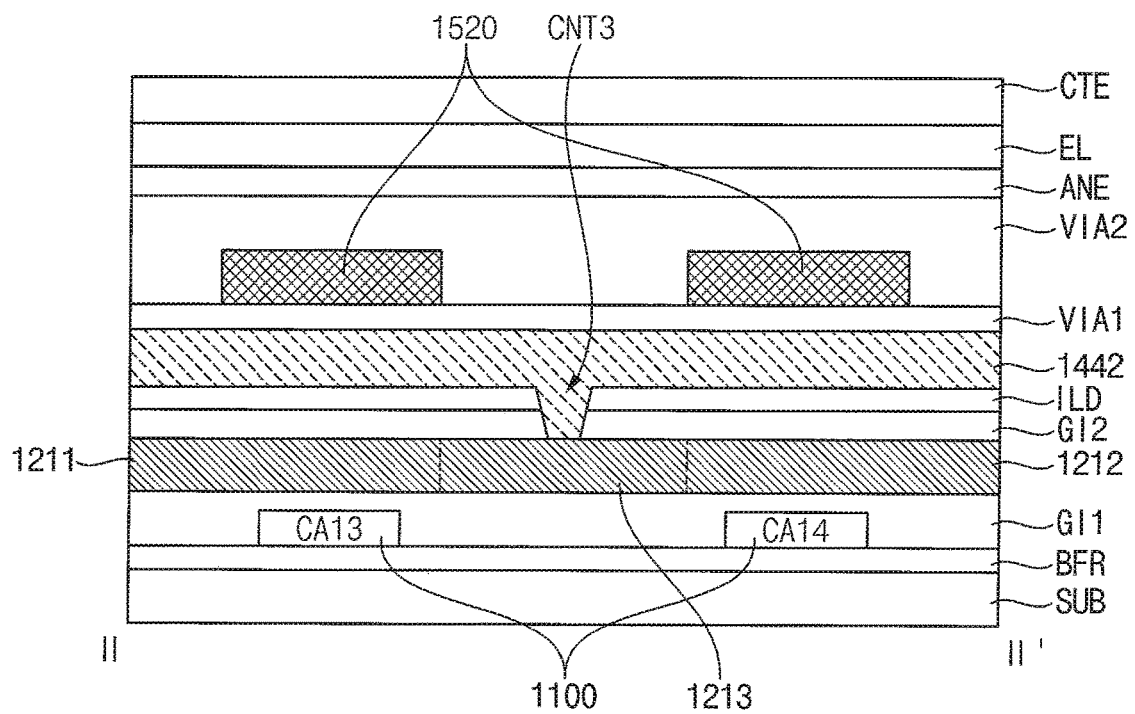
FIG. 17 is a cross-sectional view taken along line II-II' of FIG. 14.
Figure 18:
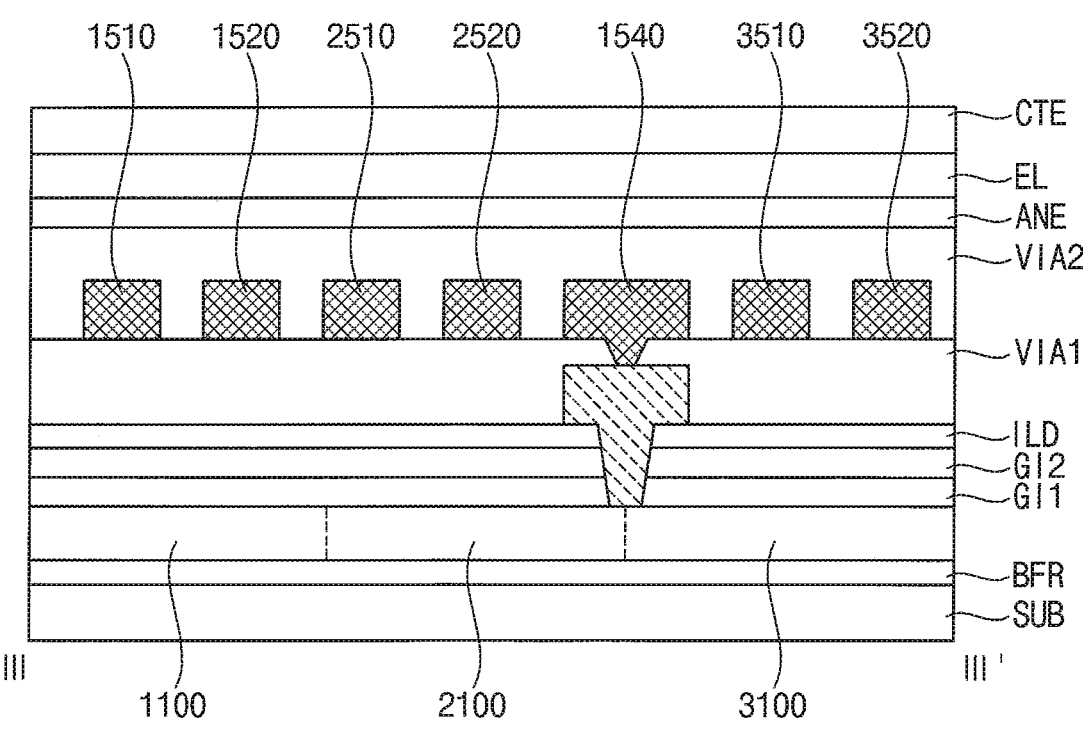
FIG. 18 is a cross-sectional view taken along line III-III' of FIG. 15.

FIGS. 5, 6, 7, 8, 9, 10, 11, 12, 13, 14, and 15 are plan views illustrating first, second, and third pixels included in the display device of FIG. 1. FIG. 16 is a cross-sectional view taken along line I-I' of FIG. 14. FIG. 17 is a cross-sectional view taken along line II-IF of FIG. 14. FIG. 18 is a cross-sectional view taken along line III-III' of FIG. 15.

Figure 5:
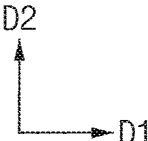
FIGS. 5, 6, 7, 8, 9, 10, 11, 12, 13, 14, and 15 are plan views illustrating first, second, and third pixels included in the display device of FIG. 1.

Referring to FIG. 5, the active pattern 100 may be disposed on the substrate SUB. The active pattern 100 may include an amorphous silicon semiconductor, a polycrystalline silicon semiconductor, an oxide semiconductor, or the like.

The active pattern 100 may include first, second, and third active patterns 1100, 2100, and 3100. The first active pattern 1100 may constitute the first pixel PX1, the second active pattern 2100 may constitute the second pixel PX2, and the third active pattern 3100 may constitute the third pixel PX3.

In an example embodiment, the first, second, and third active patterns 1100, 2100, and 3100 may be one pattern connected to each other. As the first, second, and third active patterns 1100, 2100, and 3100 are connected to each other, damage to the first, second, and third pixels PX1, PX2, and PX3 due to static electricity may be prevented.

In an example embodiment, the first, second, and third active patterns 1100, 2100, and 3100 may have substantially the same shape. For example, each of the first, second, and third active patterns 1100, 2100, and 3100 may include a plurality of channel regions. The channel regions may overlap the first conductive pattern 200.

The first active pattern 1100 may include a first channel region CA11, a second channel region CA12, a third channel region CA13, a fourth channel region CA14, and a fifth channel region CA15. The second active pattern 2100 may include a first channel region CA21, a second channel region CA22, a third channel region CA23, a fourth channel region CA24, and a fifth channel region CA25. The third active pattern 3100 may include a first channel region CA31, a second channel region CA32, a third channel region CA33, a fourth channel region CA34, and a fifth channel region CA35.

Figure 6:
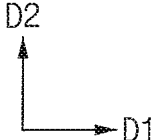
Figure 7:
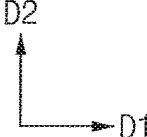

Referring to FIGS. 6 and 7, the first conductive pattern 200 may be disposed on the active pattern 100. For example, FIG. 6 is a plan view illustrating the first conductive pattern 200, and FIG. 7 may be a plan view illustrating the active pattern 100 and the first conductive pattern 200.

The first conductive pattern 200 may include a metal, an alloy, a conductive metal oxide, a transparent conductive material, and the like. For example, the first conductive pattern 200 is silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. Preferably, the first conductive pattern 200 may include molybdenum ("Mo").

The first conductive pattern 200 may include a first initialization gate electrode 1210, a second initialization gate electrode 2210, a third initialization gate electrode 3210, a first compensation gate electrode 1220, a second compensation gate electrode 2220, a third compensation gate electrode 3220, a first driving gate electrode 1230, a second driving gate electrode 2230, a third driving gate electrode 3230, the emission control line 1240, a first anode initialization electrode 1250, a second anode initialization electrode 2250, and a third anode initialization electrode 3250.

The first initialization gate electrode 1210 may include a first initialization electrode extension part 1211, a second initialization electrode extension part 1212, and an initialization electrode connection part 1213. The first initialization electrode extension part 1211 may extend in the first direction D1 and may overlap the third channel region CA13. The second initialization electrode extension part 1212 may extend in the first direction D1, may be spaced apart from the first initialization electrode extension part 1211 in the second direction D2, and may overlap the fourth channel region CA14. The initialization electrode connection part 1213 may extend in the second direction D2 and may connect the first initialization electrode extension part 1211 and the second initialization electrode extension part 1212. That is, the first initialization electrode extension part 1211 and the secondinitializationextension part 1212 are protruded from the same side of theinitialization electrode connection part 1213.

The third channel region CA13, the fourth channel region CA14, the first initialization electrode extension part 1211, and the second initialization electrode extension part 1212 may constitute the fourth dual transistors T4_1 and T4_2.

The second initialization gate electrode 2210 and the third initialization gate electrode 3210 may have substantially the same shape as the first initialization gate electrode 1210. Each of the first, second, and third initialization gate electrodes 1210, 2210, and 3210 may have an island shape. In addition, each of the first, second, and third initialization gate electrodes 1210, 2210, and 3210 may have a "C" shape.

The first compensation gate electrode 1220 may include a first electrode extension part 1221 and a first electrode protrusion part 1222. The first electrode extension part 1221 may extend in the first direction D1 and may overlap the first channel region CA11. The first electrode protrusion part 1222 may protrude from the first electrode extension part 1221 in the second direction D2 and may overlap the second channel region CA12.

The first channel region CA11, the second channel region CA12, the first electrode extension part 1221, and the first electrode protrusion part 1222 may constitute the third dual transistors T3_1 and T3_2.

In an example embodiment, the first electrode extension part 1221 may extend to overlap the fifth channel region CA25 of the second active pattern 2100. The fifth channel region CA25 and the first electrode extension part 1221 may constitute the second transistor T2.

The second compensation gate electrode 2220 and the third compensation gate electrode 3220 may have substantially the same shape as the first compensation gate electrode 1220. Each of the first, second, and third compensation gate electrodes 1220, 2220, and 3220 may have an island shape. In addition, each of the first, second, and third compensation gate electrodes 1220, 2220, and 3220 may have an "L" shape.

The first driving gate electrode 1230 may overlap the first active pattern 1100. The first active pattern 1100 and the first driving gate electrode 1230 may constitute the first transistor T1. The second driving gate electrode 2230 and the third driving gate electrode 3230 may have substantially the same shape as the first driving gate electrode 1230.

The emission control line 1240 disposed below the first, second, and third driving gate electrodes 1230, 2230, and 3230 may extend in the first direction D1. The first active pattern 1100 and the emission control line 1240 overlapping the first active pattern 1100 may constitute the fifth and sixth transistors T5 and T6.

The first anode initialization electrode 1250 extending along the first direction D1 may overlap the first active pattern 1100. The first active pattern 1100 and the first anode initialization electrode 1250 may constitute the seventh transistor T7. Each of the second and third anode initialization electrodes 2250 and 3250 may have substantially the same shape as the first anode initialization electrode 1250.

Figure 8:
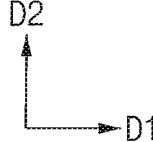
Figure 9:
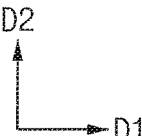

Referring to FIGS. 8 and 9, the second conductive pattern 300 may be disposed on the first conductive pattern 200. For example, FIG. 8 is a plan view illustrating the second conductive pattern 300, and FIG. 9 is a plan view illustrating the active pattern 100, the first conductive pattern 200, and the second conductive pattern 300.

The second conductive pattern 300 may include a metal, an alloy, a conductive metal oxide, a transparent conductive material, or the like. Preferably, the second conductive pattern 300 may include molybdenum ("Mo").

The second conductive pattern 300 may include a first capacitor electrode 1310, a second capacitor electrode 2310, a third capacitor electrode 3310, and a repair line 1320.

The first capacitor electrode 1310 may overlap the first driving gate electrode 1230. The first capacitor electrode 1310 may constitute the storage capacitor CST together with the first driving gate electrode 1230. A hole H penetrating the first capacitor electrode 1310 may be formed in the first capacitor electrode 1310.

The second capacitor electrode 2310 and the third capacitor electrode 3310 may have substantially the same shape as the first capacitor electrode 1310.

The repair line 1320 may extend in the first direction D1. The repair line 1320 may increase the yield of the display device 10. For example, when a defect occurs in some of the lines in a manufacturing process of the display device 10, the repair line 1320 may replace the lines.

Figure 10:
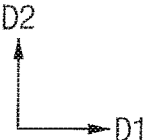
Figure 11:
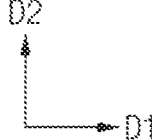

Referring to FIGS. 10 and 11, the third conductive pattern 400 may be disposed on the second conductive pattern 300. For example, FIG. 10 is a plan view illustrating the third conductive pattern 400, and FIG. 11 is a plan view illustrating the active pattern 100, the first conductive pattern 200, the second conductive pattern 300, and the third conductive pattern 400

The third conductive pattern 400 may include a metal, an alloy, a conductive metal oxide, a transparent conductive material, or the like. For example, the third conductive pattern 400 is silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like. Preferably, the third conductive pattern 400 may have a Ti/Al/Ti structure.

The third conductive pattern 400 may include an initialization connection pattern 1410, an initialization gate line 1420, first, second, and third data connection patterns 1430, 2430, and 3430, a compensation gate line 1440, and a first, second and third compensation connection patterns 1450, 2450, and 3450, a high power voltage connection pattern 1460, first, second, and third lower anode connection patterns 1470, 2470, and 3470, and an anode initialization gate line 1480.

The initialization connection pattern 1410 may overlap the active pattern 100. The initialization connection pattern 1410 may transfer the initialization voltage VINT to the first, second, and third active patterns 1100, 2100, and 3100.

The initialization gate line 1420 may extend in the first direction D1. The initialization gate line 1420 may contact the initialization electrode connection part 1213 through a third contact hole CNT3. The initialization gate line 1420 may provide the second gate signal GC to the initialization electrode connection part 1213.

The first data connection pattern 1430 may contact the first active pattern 1100 and may transmit the data voltage DATA to the first active pattern 1100. The second and third data connection patterns 2430 and 3430 may have substantially the same shape as the first data connection pattern 1430.

The compensation gate line 1440 may include a line extension portion 1441, a first line protrusion part 1442, a second line protrusion part 2442, and a third line protrusion part 3442. The compensation gate line 1440 may provide the first gate signal GW to the first, second, and third compensation gate electrodes 1220, 2220, and 3220.

The line extension part 1441 may extend in the first direction D1. In an example embodiment, the line extension part 1441 may contact the first, second, to third electrode extension parts 1221, 2221, and 3221. For example, the line extension part 1441 may contact the first electrode extension part 1221 through a first contact hole CNT1. The first contact hole CNT1 may overlap the first electrode extension part 1221 and the first line extension part 1441, and may not overlap the first active pattern 1100. In addition, the first contact hole CNT1 may overlap the first electrode extension part 1221 adjacent to one side of the first electrode protrusion part 1222.

The first line protrusion part 1442 may protrude from the line extension part 1441 in the second direction D2. In an example embodiment, the first line protrusion part 1442 may contact the first electrode protrusion part 1222. For example, the first line protrusion part 1442 may contact the first electrode protrusion part 1222 through a second contact hole CNT2. The second contact hole CNT2 may overlap the first electrode protrusion part 1222 and the first line protrusion part 1442, and may not overlap the first active pattern 1100. In addition, the second contact hole CNT2 may overlap the other side of the first electrode protrusion part 1222 opposite to the one side of the first electrode protrusion part 1222.

The second line protrusion part 2442 and the third line protrusion part 3442 which are protruded from the line extension part 1441 may have substantially the same shape as the first line protrusion part 1442.

The first compensation connection pattern 1450 may contact the first active pattern 1100 and the first driving gate electrode 1230. The second and third compensation connection patterns 2450 and 3450 may have substantially the same shape as the first compensation connection pattern 1450.

The high power voltage connection pattern 1460 may extend in the first direction D1. The high power voltage connection pattern 1460 may transmit the high power voltage ELVDD to the first, second, and third active patterns 1100, 2100, and 3100.

The first lower anode connection pattern 1470 may connect the first active pattern 1100 and the light emitting structure LES. The second and third lower anode connection patterns 2470 and 3470 may have substantially the same shape as the first lower anode connection pattern 1470.

The anode initialization gate line 1480 may extend in the first direction D1. The anode initialization gate line 1480 may provide the third gate signal GB to the first, second, and third anode initialization electrodes 1250, 2250, and 3250.

Figure 12:
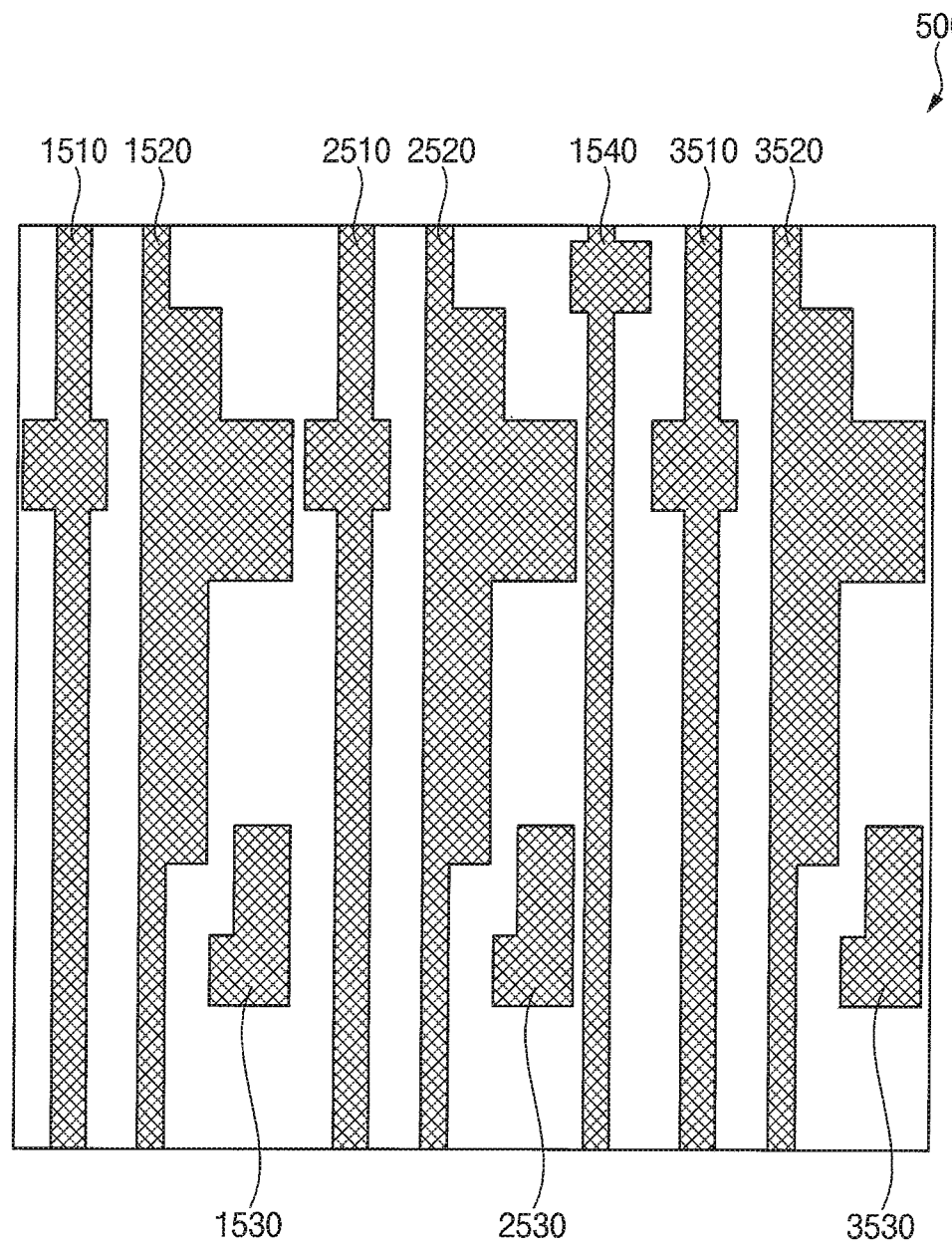
Figure 12:
Figure 13:
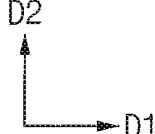

Referring to FIGS. 12 and 13, the fourth conductive pattern 500 may be disposed on the third conductive pattern 400. For example, FIG. 12 is a plan view illustrating the fourth conductive pattern 500, and FIG. 13 is a plan view of the active pattern 100, the first conductive pattern 200, the second conductive pattern 300, the third conductive pattern 400, and the fourth conductive pattern 500.

The fourth conductive pattern 500 may include a metal, an alloy, a conductive metal oxide, a transparent conductive material, and the like. Preferably, the fourth conductive pattern 500 may have a Ti/Al/Ti structure.

The fourth conductive pattern 500 may include the first, second, and third data lines 1510, 2510, and 3510, the first, second, and third high power voltage lines 1520, 2520, and 3520, the first, second, and third upper anode connection patterns 1530, 2530, and 3530, and the initialization voltage line 1540.

The first data line 1510 may extend in the second direction D2. The first data line 1510 may contact the first data connection pattern 1430. The first data line 1510 may provide the data voltage DATA to the first active pattern 1100.

Each of the second and third data lines 2510 and 3510 may have substantially the same shape as the first data line 1510.

The first high power voltage line 1520 may extend in the second direction D2. The first high power voltage line 1520 may contact the high power voltage connection pattern 1460 which extends in the first direction D1. The first high power voltage line 1520 may provide the high power voltage ELVDD to the first active pattern 1100.

Each of the second and third high power voltage lines 2520 and 3520 may have substantially the same shape as the first high power voltage line 1520.

The first upper anode connection pattern 1530 may connect the first active pattern 1100 and the light emitting structure LES. The second and third upper anode connection patterns 2530 and 3530 may have substantially the same shape as the first upper anode connection pattern 1530.

The initialization voltage line 1540 may extend in the second direction D2. The initialization voltage line 1540 may contact the initialization connection pattern 1410. The initialization voltage line 1540 may provide the initialization voltage VINT to the first, second, and third active patterns 1100, 2100, and 3100.

Figure 14:
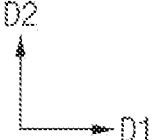

Referring to FIGS. 14 and 16, the line extension part 1441 may contact the first electrode extension part 1221 through the first contact hole CNT1, and the first line protrusion part 1442 may contact the first electrode protrusion part 1222 through the second contact hole CNT2. For example, FIG. 14 is a plan view illustrating the active pattern 100, the first conductive pattern 200, and the third conductive pattern 400.

A buffer layer BFR may be disposed on the substrate SUB. The buffer layer BFR may include an inorganic insulating material. In addition, insulating layers may be disposed between the first, second, third, and fourth conductive patterns 200, 300, 400, and 500. For example, a first gate insulating layer GI1, a second gate insulating layer GI2, an interlayer insulating layer ILD, a first via insulating layer VIA1, and a second via insulating layer VIA2 may be disposed. The first gate insulating layer GI1, the second gate insulating layer GI2, and the interlayer insulating layer ILD may include an inorganic insulating material. The first via insulating layer VIA1 and the second via insulating layer VIA2 may include an organic insulating material. A first electrode ANE, a pixel defining layer PDL, an emission layer EL, and a second electrode CTE may be disposed on the second via insulating layer VIA2. The first electrode ANE, the emission layer EL, and the second electrode CTE may constitute the light emitting structure LES. The emission layer EL may generate light by receiving the driving current from the first and second electrodes ANE and CTE.

As described above, the compensation gate line 1440 may contact the first compensation gate electrode 1220 through the first contact hole CNT1 and the second contact hole CNT2. The first gate signal GW may be provided to the first compensation gate electrode 1220 through the compensation gate line 1440.

In a conventional display device, when the compensation gate line 1440 is not connected to the first compensation gate electrode 1220, the first gate signal GW cannot be provided to the first compensation gate electrode 1220. Accordingly, since the second transistor T2 cannot perform a switching operation, a defect in which the data voltage DATA is not transmitted to the first transistor T1 may occur.

However, in the display device 10 according to an example embodiment, the compensation gate line 1440 may contact the first compensation gate electrode 1220 through the first contact hole CNT1 and the second contact hole CNT2. Accordingly, the compensation gate line 1440 may be electrically connected to the first compensation gate electrode 1220 through at least one of the first contact hole CNT1 and the second contact hole CNT2. For example, when the first contact hole CNT1 is not properly formed, the compensation gate line 1440 may still be connected to the first compensation gate electrode 1220 through the second contact hole CNT2. Accordingly, the second transistor T2 may perform a switching operation, and a defect in which the data voltage DATA is not transmitted to the first transistor T1 may be prevented.

Referring to FIGS. 14 and 17, the initialization gate line 1420 may contact the initialization electrode connection part 1213 through the third contact hole CNT3. In addition, the first high power voltage line 1520 may overlap the first initialization electrode extension part 1211 and the second initialization electrode extension part 1212. Accordingly, the first high power voltage line 1520 may prevent a coupling phenomenon that may occur in the first initialization electrode extension part 1211 and the second initialization electrode extension part 1212.

Figure 15:

Referring to FIGS. 15 and 18, the initialization voltage line 1540 may contact the initialization connection pattern 1410 and may provide the initialization voltage VINT through the initialization connection pattern 1410. The initialization connection pattern 1410 may transfer the initialization voltage VINT to the first to third active patterns 1100, 2100, and 3100 connected to each other. Accordingly, the first to third pixels PX1, PX2, and PX3 may not include an additional initialization voltage line, and planar areas of the first to third pixels PX1, PX2, and PX3 may be reduced. Accordingly, a resolution of the display device 10 may be improved.

Although certain example embodiments and implementations have been described herein, other embodiments and modifications will be apparent from this description. Accordingly, the present disclosure is not limited to such embodiments, but rather to the broader scope of the appended claims and various obvious modifications and equivalent arrangements as would be apparent to a person of ordinary skill in the art.

What is claimed is:

1. A display device comprising:
a first active pattern;
a first gate electrode overlapping the first active pattern, including a first electrode extension part and a first electrode protrusion part protruding from the first electrode extension part; and
a first gate line overlapping the first gate electrode and including a line extension part and a line protrusion part protruding from the line extension part,
wherein the line extension part contacts the first electrode extension part through a first contact hole, and
wherein the line protrusion part contacts the first electrode protrusion part through a second contact hole.

2. The display device of claim 1, wherein the first gate line is electrically connected to the first gate electrode through at least one of the first contact hole and the second contact hole.

3. The display device of claim 1, wherein the first contact hole overlaps the first electrode extension part adjacent to one side of the first electrode protrusion part, and
wherein the second contact hole overlaps another side of the first electrode protrusion part opposite to the one side of the first electrode protrusion part.

4. The display device of claim 1, wherein the first contact hole and the second contact hole do not overlap the first active pattern.

5. The display device of claim 1, wherein the first electrode extension part and the line extension part overlap each other, and
wherein the first electrode protrusion part and the line protrusion part overlap each other.

6. The display device of claim 1, wherein a shape of the first electrode protrusion part is a same as a shape of the line protrusion part.

7. The display device of claim 1, wherein the first electrode extension part overlaps a first channel region of the first active pattern, and
wherein the first electrode protrusion part overlaps a second channel region of the first active pattern.

8. The display device of claim 1, further comprising:
a second gate electrode overlapping the first active pattern, and
a second gate line overlapping the second gate electrode.

9. The display device of claim 8, wherein the second gate electrode includes:
a second electrode extension part; and
a second electrode connection part protruding from the second electrode extension part.

10. The display device of claim 9, wherein the second electrode extension part overlaps a third channel region of the first active pattern.

11. The display device of claim 9, wherein the second gate line contacts the second electrode connection part through a third contact hole.

12. The display device of claim 1, further comprising:
a second active pattern connected to the first active pattern and being disposed in a same layer as the first active pattern; and
a third active pattern connected to the second active pattern and being disposed in a same layer as the second active pattern.

13. The display device of claim 12, wherein the first electrode extension part extends to overlap a fifth channel region of the second active pattern.

14. The display device of claim 12, further comprising:
a voltage line overlapping at least one of the first active pattern, the second active pattern, and the third active pattern,
wherein the voltage line provides an initialization voltage to the first, second, and third active patterns.

15. The display device of claim 1, wherein the first gate electrode includes molybdenum, and
wherein the first gate line includes aluminum.

\* \* \* \* \*